(12) United States Patent
Matsuura (10) Patent No.: US 7,625,609 B2
(45) Date of Patent: *Dec. 1, 2009

(54) FORMATION OF SILICON NITRIDE FILM

(75) Inventor: Hiroyuki Matsuura, Tokyo-To (JP)

(73) Assignee: Tokyo Electron Limited, Tokyo (JP)

(*) Notice: Subject to any disclaimer, the term of this patent is extended or adjusted under 35 U.S.C. 154(b) by 644 days.

This patent is subject to a terminal disclaimer.

(21) Appl. No.: 11/389,097

(22) Filed: Mar. 27, 2006

(65) Prior Publication Data

US 2006/0216418 A1 Sep. 28, 2006

(30) Foreign Application Priority Data

Mar. 28, 2005 (JP) ............... 2005-092353

(51) Int. Cl.
*H05H 1/24* (2006.01)
(52) U.S. Cl. ............... 427/579; 427/255.393; 427/255.394; 117/88; 117/92; 117/103
(58) Field of Classification Search ............ 427/248.1, 427/255.393, 255.394, 578, 579; 117/88, 117/92, 103

See application file for complete search history.

(56) References Cited

U.S. PATENT DOCUMENTS

| | | | | |
|---|---|---|---|---|
| 5,258,169 A | * | 11/1993 | Wannagat et al. | 423/344 |
| 5,422,088 A | * | 6/1995 | Burgie et al. | 423/342 |
| 6,010,949 A | * | 1/2000 | Li et al. | 438/439 |
| 6,468,924 B2 | | 10/2002 | Lee et al. | |
| 6,720,027 B2 | * | 4/2004 | Yang et al. | 427/123 |
| 6,838,125 B2 | * | 1/2005 | Chung et al. | 427/562 |
| 7,081,271 B2 | * | 7/2006 | Chung et al. | 427/255.391 |

(Continued)

FOREIGN PATENT DOCUMENTS

| | | |
|---|---|---|
| JP | 2004-281853 | 10/2004 |
| KR | 2002-0044422 | 6/2002 |
| KR | 2003-0064083 | 7/2003 |
| KR | 2003-0083132 | 10/2003 |

OTHER PUBLICATIONS

Lopez-Suarez, A., et al., "Study of the influence of NH3 flow rates on the structure and photoluminescence of silicon nitride films with silicon nanoparticles". Physica E 40 (2008) pp. 3141-3146.*

(Continued)

*Primary Examiner*—Bret Chen
(74) *Attorney, Agent, or Firm*—Smith, Gambrell & Russell, LLP (57) ABSTRACT

A method of forming a silicon nitride film which can form a silicon nitride film having a high film stress at a low process temperature is described herein. The method includes the steps of (a) supplying dichlorosilane into a reaction chamber containing a process object, thereby allowing chemical species originated from dichlorosilane as a precursor to be adsorbed on the process object; (b) hydrogenating chlorine contained in the chemical species, thereby removing the chlorine from the chemical species; and (c) supplying ammonia radicals into the reaction chamber, thereby nitriding the chemical species, from which the chlorine has been removed, by the ammonia radicals to, deposit resultant silicon nitride on the process object, wherein the steps (a), (b) and (c) are performed repeatedly for plural times in that order, thereby a silicon nitride film of a desired thickness is formed on a semiconductor wafer.

10 Claims, 4 Drawing Sheets

U.S. PATENT DOCUMENTS

| | | | |
|---|---|---|---|
| 7,442,656 B2* | 10/2008 | Matsuura | 438/788 |
| 2003/0059535 A1* | 3/2003 | Luo et al. | 427/255.28 |
| 2003/0215570 A1* | 11/2003 | Seutter et al. | 427/255.394 |
| 2003/0228770 A1* | 12/2003 | Lee et al. | 438/791 |
| 2004/0058556 A1* | 3/2004 | You et al. | 438/745 |
| 2004/0121085 A1* | 6/2004 | Wang et al. | 427/569 |
| 2005/0159017 A1* | 7/2005 | Kim et al. | 438/791 |
| 2005/0223982 A1 | 10/2005 | Park et al. | |
| 2005/0227017 A1* | 10/2005 | Senzaki et al. | 427/459 |
| 2006/0216418 A1* | 9/2006 | Matsuura | 427/248.1 |

OTHER PUBLICATIONS

Mui, Collin, et al., "Surface reaction mechanisms for atomic layer deposition of silicon nitride". Surface Science 557 (2004) pp. 159-170.*

Liu, Xue-Jian, et al., "Growth and properties of silicon nitride films prepared by low pressure chemical vapor deposition using trichlorosilane and ammonia". Thin Solid Films 460 (2004) pp. 72-77.*

Chinese Office Action issued on Jul. 11, 2008 with partial English translation.

Korean Office Action issued on Apr. 29, 2009 for Korean Patent Application No. 10-2006-27288 with English translation.

* cited by examiner

FORMATION OF SILICON NITRIDE FILM

TECHNICAL FIELD

The present invention relates to a technique for forming a silicon nitride film.

BACKGROUND ART

A semiconductor device fabricating process includes a step of forming a silicon nitride film on a process object such as a semiconductor wafer by using an ALD process.

The ALD process alternately supplies two (or more) different source gases one by one onto a process object under predetermined process conditions, so that chemical species is adsorbed to the process object at a single atomic layer level, and are deposited on the process object through surface reactions. For instance, first and second source gases are alternately supplied to a process object to flow along the surface thereof, thereby molecules contained in the first source gas adsorb to the surface, and molecules contained in the second source gas react with the adsorbed molecules originated from the first source gas to form a film of a thickness of a single molecule level. The above process steps are performed repeatedly, so that a high-quality dielectric film, specifically a film of a high dielectric constant (high-k), is formed on the process object.

JP2004-281853A discloses that, when forming a silicon nitride film by an ALD process by alternately supplying dichlorosilane (DCS: $SiH_2Cl_2$) gas and ammonia ($NH_3$) gas, if the ammonia gas is supplied after it is activated to be converted into ammonia radicals, the silicon nitride film can be formed at a low process temperature in a range of 300° C. to 600° C.

However, a silicon nitride film deposited at a low process temperature by using an ALD process has a high wet-etch rate, and thus, the etching selectivity of the silicon nitride film over an oxide film is small. Moreover, a silicon nitride film deposited under a low process temperature has a low film stress, and cannot achieve desired stress strength.

SUMMARY OF THE INVENTION

The present invention has been made in view of the aforementioned problems, and it is therefore an object of the present invention to provide a technique for forming a silicon nitride film having a high stress at a low process temperature.

Another object of the present invention is to provide a technique for forming a silicon nitride film having a low wet-etch rate.

Another object of the present invention is to provide a technique for controlling a stress of a silicon nitride film.

In order to achieve the above objectives, according to the first aspect of the present invention, there is provided a method of forming a silicon nitride film, which method including the steps of: (a) supplying dichlorosilane into a reaction chamber containing a process object, thereby allowing chemical species originated from dichlorosilane as a precursor to be adsorbed on the process object; (b) hydrogenating chlorine contained in the chemical species, thereby removing the chlorine from the chemical species; and (c) supplying ammonia radicals into the reaction chamber, thereby nitriding the chemical species, from which the chlorine has been removed, by the ammonia radicals, to deposit resultant silicon nitride on the process object, wherein the steps (a), (b) and (c) are performed repeatedly for plural times in that order.

Preferably, in the step (a), pressure in the reaction chamber is in a range of 40 Pa to 100 Pa.

Preferably, in the step (c), ammonia radicals are generated by supplying ammonia to a plasma generating unit whose internal pressure is in a range of 70 Pa to 600 Pa, and the ammonia radicals thus generated are supplied into the reaction chamber from the plasma generating unit.

Preferably, the step (b) includes a step of supplying hydrogen radicals into the reaction chamber, thereby reacting the hydrogen radicals with the chemical species to hydrogenating the chlorine contained in the chemical species.

Preferably, in the step (b), pressure in the reaction chamber is in a range of 40 Pa to 100 Pa.

Preferably, in the step (b), hydrogen radicals are generated by supplying hydrogen to a plasma generating unit whose internal pressure is in a range of 70 Pa to 400 Pa, and the hydrogen radicals thus generated are supplied into the reaction chamber from the plasma generating unit.

Preferably, in the step (c), temperature in the reaction chamber is 200° C. to 500° C.

The method may further include a step of performing the steps (a) and (c) repeatedly for plural times without performing the step (b), before performing the steps (a), (b) and (c) repeatedly for plural times in that order.

According to the second aspect of the present invention, there is provided an apparatus for forming a silicon nitride film, which includes: a reaction chamber adapted to contain a process object therein; exhaust means for evacuating a gas in the reaction chamber; dichlorosilane supply means for supplying dichlorosilane into the processing chamber; hydrogen-radical supply means for supplying hydrogen radicals into the processing chamber; ammonia-radical supply means for supplying ammonia radicals into the processing chamber; a controller configured to control the exhaust means, the dichlorosilane supply means, the hydrogen-radical supply means, the ammonia-radical supply means to perform the following process steps including: (a) controlling the dichlorosilane supply means to supply dichlorosilane into the reaction chamber containing a process object, thereby allowing chemical species originated from dichlorosilane as a precursor to be adsorbed on the process object; (b) controlling the hydrogen-radical supply means to supply hydrogen radicals into the reaction chamber, thereby hydrogenating chlorine contained in the chemical species to remove the chlorine from the chemical species; and (c) controlling the exhaust means to regulate pressure in the reaction chamber at a pressure in a range of 40 Pa to 100 Pa, and controlling the ammonia-radical supply means to supply ammonia radicals into the reaction chamber, thereby nitriding the chemical species, from which the chlorine has been removed, by the ammonia radicals, to deposit resultant silicon nitride on, the process object, wherein the steps (a), (b) and (c) are performed repeatedly for plural times in that order.

According to the third aspect of the present invention, there is provided a storage medium storing a program executable by a control computer of a processing apparatus, wherein, upon execution of the program, the control computer controls the processing apparatus to make the processing apparatus perform a method of forming a silicon nitride film, the method including the steps of: (a) supplying dichlorosilane into a reaction chamber containing a process object, thereby allowing chemical species originated from dichlorosilane as a precursor to be adsorbed on the process object; (b) hydrogenating a chlorine contained in the chemical species, thereby removing the chlorine from the chemical species; and (c) supplying ammonia radicals into the reaction chamber, thereby nitriding the chemical species, from which the chlorine has been removed, by the ammonia radicals to deposit resultant silicon nitride on the process object, wherein the steps (a), (b) and (c) are performed repeatedly for plural times in that order.

DESCRIPTION OF PREFERRED EMBODIMENTS

A preferred embodiment of the present invention will be described with reference to the attached drawings. In the illustrated embodiment described below, a batch-type, vertical processing apparatus is used as an apparatus for forming a silicon nitride film.

Figure 1:
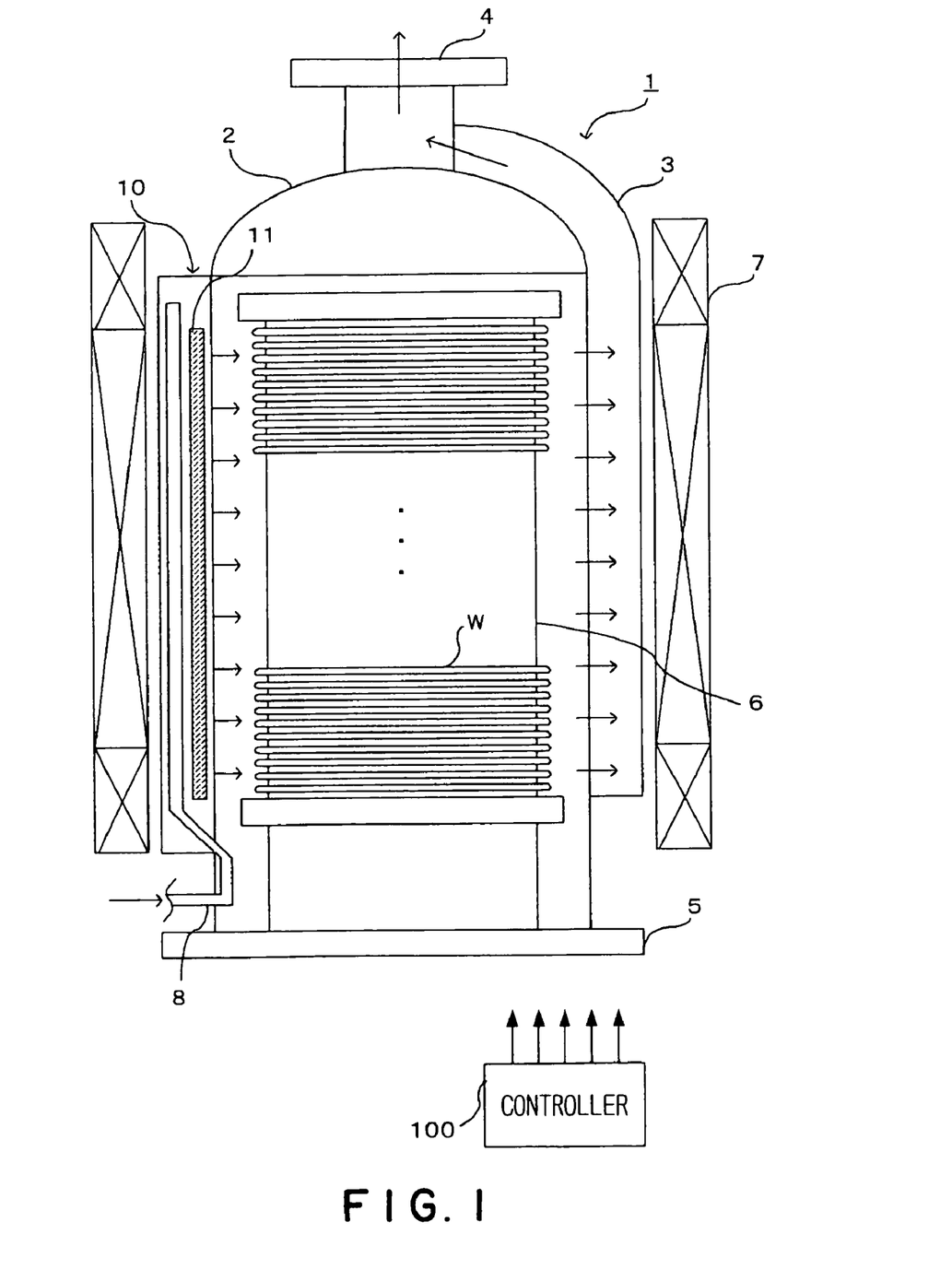
FIG. 1 is a vertical cross-sectional view schematically showing the structure of a processing apparatus in one embodiment of the present invention.

As shown in FIG. 1, a processing apparatus 1 includes a reaction tube having a cylindrical shape with its longitudinal axis being directed to a vertical direction. The reaction tube 2 is made of a heat-resistant, corrosion-resistant material such as quartz.

An exhaust chamber 3 is arranged on one side of the reaction tube 2 to discharge gases in the reaction tube 2. The exhaust chamber 3 is connected to an interior of the reaction tube 2 through an opening, which is formed in a side wall of the reaction tube 2 and extends vertically. The top end of the exhaust chamber 3 is connected to an exhaust port 4 arranged at the top of the reaction tube 2. Connected to the exhaust port 4 is a not shown exhaust pipe, in which a pressure control mechanism including devices, such as a valve and a vacuum pump 127 (described later), are arranged. Gases in the reaction vessel 2 is discharged, through the not shown opening, the exhaust chamber 3 and the exhaust port 4, to the not shown exhaust pipe by means of the exhaust mechanism, thereby pressure in the reaction tube 2 is regulated at a desired pressure (vacuum).

A lid 5 is arranged below the reaction tube 2. The lid 5 is made of a heat-resistant, corrosion-resistant material such as quartz. The lid 5 is capable of vertical movement by means of a boat elevator 128, described later. When the boat elevator 128 elevates the lid 5, a lower opening (i.e., furnace throat) of the reaction tube 2 is closed. When the boat elevator 128 lowers the lid 5, the lower opening of the reaction tube 2 is opened.

A wafer boat 6 is placed on the lid 5. The wafer boat 6 is made of quartz, for example. The wafer boat 6 holds plural semiconductor wafers W while they are spaced at vertical intervals. The lid 5 may be provided thereon with an insulating tube for preventing temperature drop in the reaction tube 2 due to heat dissipation through the furnace throat of the reaction tube 2, and/or may be provided with a rotary table for rotating the wafer boat 6 to be placed thereon. In this case, the wafer boat 6 is mounted to the lid 5 via the above additional component member(s), and temperature of the, semiconductor wafers W held by the wafer boat 6 can be readily controlled with high uniformity.

Plural heaters 7 surround the circumference of the reaction tube 2. Each of the heaters 7 may be formed of a resistance heating element. The heaters 7 heat the interior of the reaction tube 2, and thus the semiconductor wafers W are heated up to a predetermined temperature.

Figure 2:
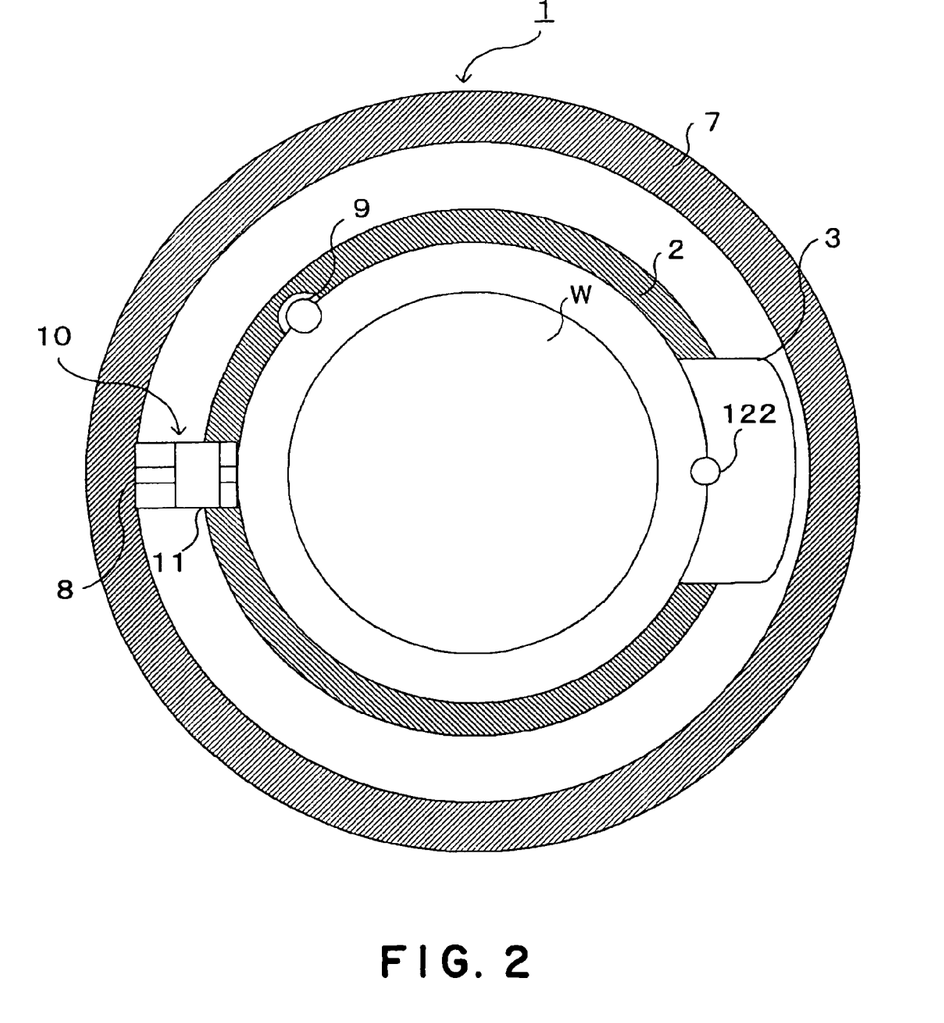
FIG. 2 is a transverse cross-sectional view schematically showing the structure of the processing apparatus shown in FIG. 1.

Process gas supply pipes 8 and 9, for supplying process gases (e.g., diclorosilane (DCS: $SiH_2Cl_2$) gas, ammonia ($NH_3$) gas, hydrogen ($H_2$) gas, nitrogen ($N_2$) gas), penetrate a lower end portion of the side wall of the reaction tube 2. Each of the process gas supply pipes 8 and 9 is connected to a process gas supply source through a mass-flow controller (MFC) 125. Note that: FIG. 1 shows only the process gas supply pipe 8 for supplying process gases involving a plasma process (in the illustrated embodiment, ammonia gas and hydrogen gas), for simplicity of the drawing; and that FIG. 2 shows both the process gas supply pipe 8, and the process gas supply pipe 9 which supplies gases not involving the plasma process (in the illustrated embodiment, diclorosilane gas and nitrogen gas). The process gas supply pipe 9 may be provided with a diffusion injector.

A plasma generating unit 10 is arranged on the other side of the reaction tube 2, namely, the side of the reaction tube 2 opposed to the exhaust chamber 3. The plasma generating unit 10 is made of a heat-resistant, corrosion-resistant material such as quartz. The plasma generating unit 10 is includes the process gas supply pipe 8 for supplying ammonia gas and hydrogen gas, and a pair of electrodes 11. The process gas supply pipe 8 may be arranged between the electrodes 11 so that the pipe 8 is capable of supplying ammonia gas and hydrogen gas into a space between the electrodes 11. The electrodes 11 are connected to a radio-frequency (RF) power supply, not shown, and a matching circuit, not shown. By applying RF power across the electrodes 11, a gas containing ammonia gas is plasma-exited (activated), thereby active species containing ammonia radicals (NH3*) is generated, which active species is supplied into the reaction tube 2 from the plasma generating unit 10.

Plural temperature sensors 122 each comprising a thermocouple for measuring temperatures are arranged in the reaction tube 2. Plural pressure gauges 123 for measuring pressures in the reaction tube 2 are arranged in the reaction tube 2.

Figure 3:
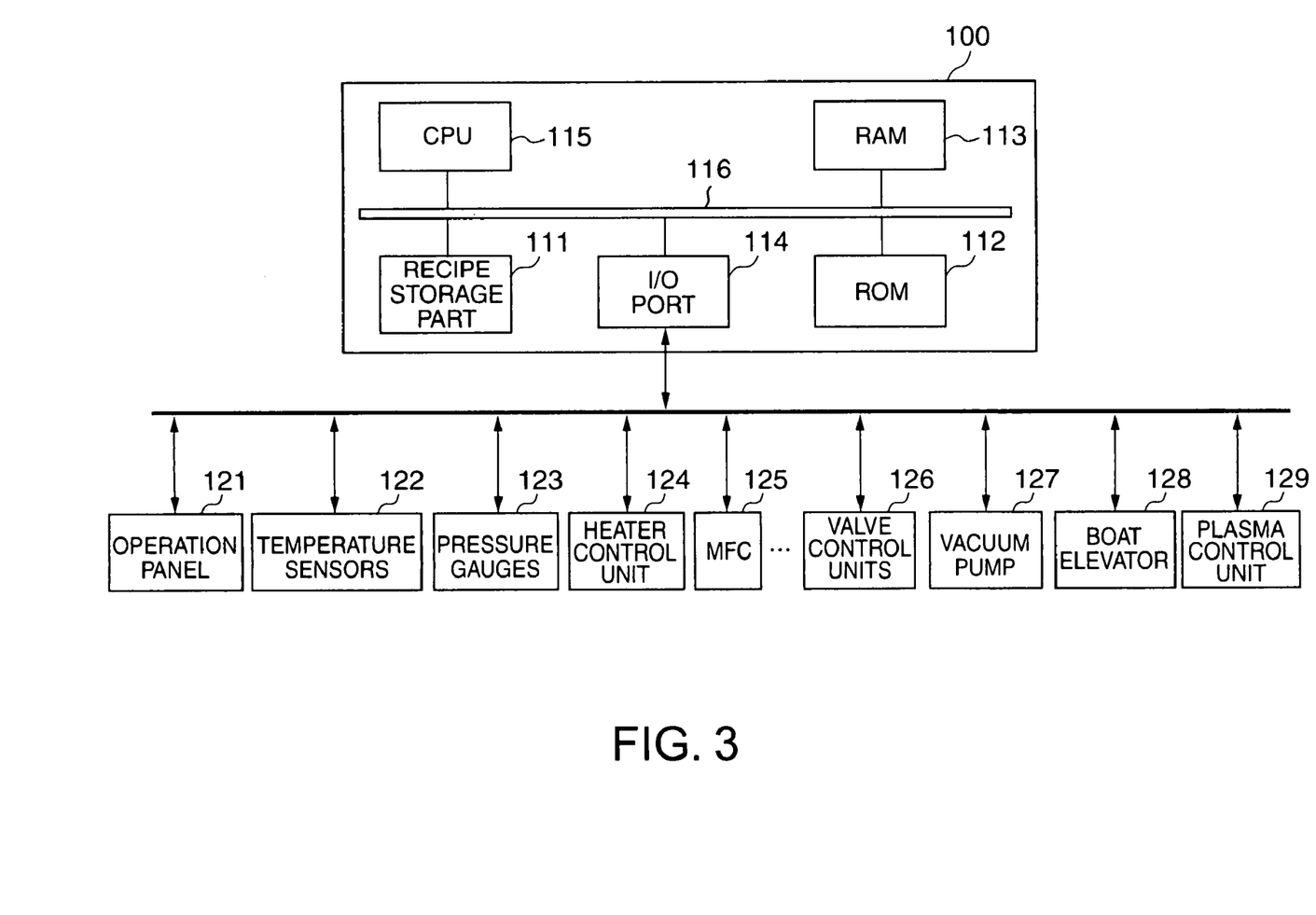
FIG. 3 is a block diagram showing the structure of a controller of the processing apparatus and parts connected to the controller.

A processing apparatus 1 includes a controller 100 for controlling various functional component parts constituting the processing apparatus 1. FIG. 3 shows the structure of the controller 100. The controller 100 is connected to an operation panel 121, the temperature sensors 122, the pressure gauges 123, a heater control unit 124, the MFCs 125, valve control units 126, the vacuum pump 127, the boat elevator 128, and a plasma control unit 129.

The operation panel 121 has a display and operation buttons, sends command signals corresponding to operator's instructions inputted to the operation panel 121 to the controller 100, and displays various information received from the controller 100 on the display.

The temperature sensors 122 measure temperatures of the various parts in the reaction tube 2 and the exhaust chamber 3, and send the measurement results to the controller 100. The pressure gauges 123 measure pressures of the various parts in the reaction tube 2 and the exhaust chamber 3, and send the measurement results to the controller 100.

The heater control unit 124 controls the heaters 7 individually, energizes the heaters 7 to generate heat, and measures the power consumption of the heaters 7 individually to send the measurement results to the controller 100.

The MFCs 125 are arranged respectively in pipes, such as process gas supply pipes 8 and 9, control respective flow rates of gases flowing through the pipes so that they coincide with target values instructed by the controller 100, and measure actual gas flow rates to send them to the controller 100.

The valve control units 126 are respectively assigned to the pipes, and controls the opening of a valve arranged in each of the pipes so that it coincides with the target value instructed by the controller 100. The vacuum pump 127 is connected to the exhaust pipe, not shown, and evacuates gases in the reaction tube 2.

The boat elevator 128 elevates the lid 5 to load the wafer boat 6 holding semiconductor wafers W into the reaction tube 2, and lowers the lid 5 to unload the wafer boat 6 from the reaction tube 2.

The plasma control unit 129 controls the plasma generating unit 10 in response to instructions sent from the controller 100, thereby to activate a process gas (e.g., ammonia gas) supplied into the plasma generating unit 10 to generate active species (e.g., ammonia radicals ($NH_3^*$)) originated from the process gas.

The controller 100 includes a recipe storage part 111, a ROM (read-only memory) 112, a RAM (random access memory) 113, I/O (input-output) port 114, CPU 115, and a bus 116 connecting them each other.

A setup recipe and process recipes are stored in the recipe storage part 111. In default condition (as-fabricated condition) of the processing apparatus 1, the recipe storage part 111 stores only the setup recipe. The setup recipe is executed when customizing or calibrating a thermal model for temperature control depending on the individual characteristics (i.e., machine difference) of the processing apparatus 1. The process recipes are prepared in correspondence to the processes to be carried out by a user. Each process recipe defines various process conditions to be achieved in a period from loading of semiconductor wafers W into the reaction tube 2 to unloading of the semiconductor wafers W from the reaction tube 2. The process conditions include: change in temperatures of various part of the processing apparatus 1; change in pressure in the reaction tube 2; timings of starting and stopping the supply of process gases; flow rates of the process gases; and so on.

The ROM 112 may be composed of an EEPROM, a flash memory, a hard disk drive or a combination thereof. The ROM 112 is a storage medium that stores operation programs and so on for the CPU 115. The RAM 113 functions as a work area for the CPU 115.

The I/O port 114 is connected to the operation panel 121, the temperature sensors 122, the pressure gauges 123, the heater control unit 124, the MFCs 125, valve control units 126, the vacuum pump 127, the boat elevator 128, a plasma control unit 129, and so on, to control inputting and outputting of data or signals.

The CPU (Central Processing Unit) 115 acts as the center of the controller 100, executes a control program stored in the ROM 112, and controls operations of the functional component parts of the processing apparatus 1 according to the recipe (process recipe) stored in the recipe storage part 111 in response to commands sent from the operation panel 121. That is, the CPU 115 makes the measuring devices, such as the temperature sensors 122, the pressure sensors 123 and the MFCs 125, measure temperatures, pressures, flow rates in the reaction tube 2 and the exhaust pipe and so on. The CPU 115 outputs control signals, which are generated based on the measurement results, to the functional component parts, such as the heater control unit 123, MFCs 125, the valve control units 126 and the vacuum pump 127, thereby to control them so that the process conditions defined by the process recipe are achieved. The bus 116 communicates data between the elements.

Next, the method of forming a silicon nitride film performed by using the aforementioned processing apparatus will be described. In the illustrated embodiment, a silicon nitride film is formed on each semiconductor wafer W by using an ALD (Atomic Layer Deposition) process. As described in the recipe shown in FIG. 4, the silicon nitride film forming method includes a DCS supplying step, a chlorine removing step and an ammonia supplying step. These process steps form one cycle of the ALD process. A silicon nitride film of a desired thickness can be formed on each semiconductor wafer W by repeatedly executing the cycle for plural times such as 200 times (cycles).

Although not mentioned in each case in the below description, when the film forming method is being performed, the functional components parts of the processing apparatus 1 are controlled by the controller 100 (CPU 115); and the process conditions, such as temperatures and pressures in the reaction tuber 2 and gas flow rates, are controlled according to the process recipe (time sequence diagram) of FIG. 4, by controlling the heater control units 124 (heaters 7), the MFCs 125 (process gas supply pipes 8 and 9), the valve control units 126, the vacuum pump 127 and the plasma control unit (plasma generating unit 10) by the controller 100 (CPU 115).

First, semiconductor wafers W, namely, process objects, are loaded into the reaction tube 2. In detail, the interior of the reaction tube 2 is maintained at a predetermined loading temperature by using the heaters 7, and nitrogen gas is supplied into the reaction tube 2 at a predetermined flow rate. The wafer boat 6 holding semiconductor wafers W is placed on the lid 5. The boat elevator 128 elevates the lid 5 to load the wafer boat 6 into the reaction tube 2.

Then, the DCS step is executed. Nitrogen gas is supplied into the reaction tube 2 through the process gas supply pipe 9 at a predetermined flow rate such as 0.5 slm as shown in item (c) of FIG. 4, and the temperature of the interior of the reaction tube 2 is adjusted to a predetermined value such as 400° C. by the heaters 7 as shown in item (a) of FIG. 4. In addition, gases in the reaction tube 2 are evacuated so that the pressure in the reaction tube 2 is adjusted to a predetermined value such as 400 Pa as shown in item (b) of FIG. 4. The above operations are continued until the pressure and the temperature in the reaction tube 2 are stabilized at the predetermined values (Stabilizing Stage).

Figure 4:
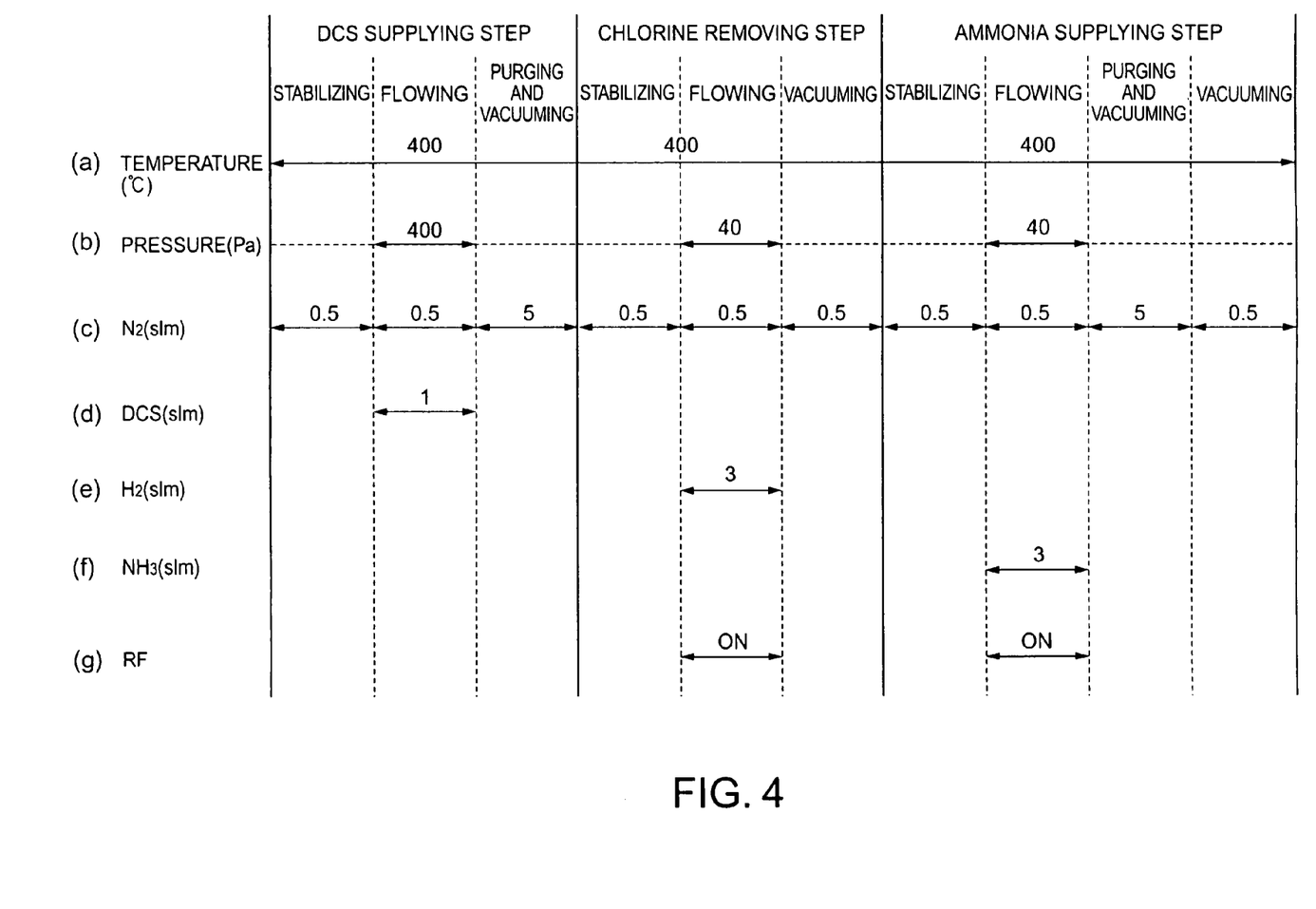
FIG. 4 is a chart showing an example of a process recipe for a silicon nitride film forming method according to the present invention.

After the pressure and the temperature in the reaction tube 2 are stabilized, DCS gas is supplied into the reaction tube 2 through the process gas supply pipe 9 at a predetermined flow rate such as 1 slm as shown in item (d) of FIG. 4, while nitrogen gas is supplied into the reaction tube 2 through the process gas supply pipe 9 at a predetermined flow rate such as 0.5 slm as shown in item (c) of FIG. 4 (Flowing Stage).

Preferably, the temperature in the reaction tube 2 is adjusted at a value in a range of 200° C. to 500° C. If lower than 200° C., there is a possibility that a silicon nitride film cannot be formed. If higher than 500° C., hydrogenation (mentioned later) is not necessary. More preferably, the temperature in the reaction tube 2 is adjusted at a value in a range of 390° C. to 410° C. By using this temperature range, the deposition rate of is increased, and various characteristics, such as film-thickness uniformity, wet-etch rate and film stress, of the finally obtained silicon nitride film can be improved.

In view of the management of film-deposition conditions, when forming a film by using an ALD process, it is preferable that the temperature in the reaction is not varied throughout the process. Accordingly, in the illustrated embodiment, the process temperatures (i.e., temperature in the reaction tube 2) in the chlorine removing step and the ammonia supplying step (mentioned later in detail) are the same as that in the DCS supplying step.

Preferably, the pressure in the reaction tube 2 is adjusted at a value in a range of 400 Pa to 1200 Pa. By using this pressure range, the reaction rate between nitrogen atoms and DCS gas is increased. More preferably, the pressure in the reaction tube 2 is adjusted at a value in a range of 800 Pa to 1000 Pa. By using this pressure range, the pressure in the reaction tube 2 can be readily regulated.

Preferably, DCS gas flow rate is in a range of 1 slm to 5 slm. If lower than 1 slm, there is a possibility that a sufficient amount of DCS is not supplied to nitrogen atoms on the semiconductor wafer W. If higher than 5 slm, there is a possibility that an amount of DCS which does not react with nitrogen atoms on the semiconductor wafer W increases. More preferably, DCS gas flow rate is in a range of 3 slm to 4.5 slm. By using this flow-rate range, reaction between nitrogen atoms on the semiconductor wafer W and DCS is promoted.

DCS gas thus supplied is heated in the reaction tube 2, is activated, reacts with $NH_2$ on the semiconductor wafer W as shown in the below reaction formula 1, and is adsorbed to the surface of the semiconductor wafer W.

—$NH_2$+$SiH_2Cl_2$→—NH—$SiH_2Cl$+HCl↑     (Reaction Formula 1)

After a predetermined amount of DCS-originated chemical species is adsorbed, the supply of DCS gas through the process gas supply pipe 9 is stopped. Then, the interior of the reaction vessel 2 is evacuated while nitrogen gas is supplied into the reaction vessel 2 through the process gas supply pipe 9 at a predetermined flow rate such as 5 slm as shown in item (c) of FIG. 4, thereby discharging gases from the reaction tube 2 to purge the reaction tube 2 (Purging-and-Vacuuming Stage).

Subsequently, the chlorine removing step is executed. The chlorine removing step hydrogenates chlorine contained in chemical species (—$SiH_2Cl$) adsorbed to the semiconductor wafer W in the DCS supplying step, thereby to remove the chlorine from the chemical species. In the illustrated embodiment, hydrogen is substituted for chlorine by supplying hydrogen radicals onto the semiconductor wafer W.

In the chlorine removing step, first, nitrogen gas is supplied into the reaction tube 2 through the process gas supply pipe 9 at a predetermined flow rate such as 0.5 slm as shown in item (c) of FIG. 4, and the temperature of the interior of the reaction tube 2 is adjusted to a predetermined value such as 400° C. by the heaters 7 as shown in item (a) of FIG. 4. In addition, gases in the reaction tube 2 are evacuated so that the pressure in the reaction tube 2 is adjusted to a predetermined value such as 40 Pa as shown in item (b) of FIG. 4. The above operations are continued until the pressure and the temperature in the reaction tube 2 are stabilized at the predetermined values (Stabilizing Stage).

After the pressure and the temperature in the reaction tube 2 are stabilized, RF power of a predetermined frequency such as 13.56 MHz is applied (RF: ON) across the pair of electrodes 11 in the plasma generating unit 10 from the not shown the RF power source through the not shown matching circuit as shown in item (g) of FIG. 4, while hydrogen gas is supplied into a space between the electrodes 11 through the process gas supply pipe 8 at a predetermined flow rate such as 3 slm as shown in item (e) of FIG. 4. Hydrogen gas supplied into the space between the electrodes 11 is plasma-excited (i.e., activated) to be converted into hydrogen radicals (H2*, H*), which are supplied from the plasma generating unit 10 into the reaction tube 2. In addition, nitrogen gas is supplied into the reaction tube 2 through the process gas supply pipe 9 at a predetermined flow rate such as 0.5 slm, as shown in item (c) of FIG. 4 (Flowing Stage).

Preferably, the hydrogen-gas flow rate is in a range of 0.5 slm to 5 slm. By using this flow-rate range, plasma can be generated without any trouble, and it is possible to supply a sufficient amount of hydrogen radicals to substitute hydrogen for chlorine on the semiconductor wafer W. More preferably, the hydrogen-gas flow rate is in a range of 1.5 slm to 2.3 slm. By using this flow-rate range, oxygen concentration in the film can be further lowered.

The RF power is, preferably, in a range of 50 W to 1000 W, more preferably, in a range of 100 W to 300 W. If higher than 300 W, quartz walls constituting the plasma generating unit 10 may be damaged.

Preferably, the pressure in the reaction tube 2 is in a range of 40 Pa to 100 Pa. By using this pressure range, hydrogen radicals can be readily generated, and the mean free path of the hydrogen radicals in the space where the semiconductor wafers W are placed becomes larger. More preferably, the pressure in the reaction tube 2 is in a range of 50 Pa to 70 Pa. By using this pressure range, the pressure in the reaction tube 2 can be readily regulated.

The pressure in the plasma generating unit 10 is, preferably, in a range of 70 Pa to 400 Pa, more preferably, in a range of 350 Pa to 400 Pa. By using this pressure range, plasma can be generated without any trouble, and it is possible to supply a sufficient amount of hydrogen radicals to substitute hydrogen for chlorine on the semiconductor wafer W.

When hydrogen radicals are supplied into the reaction tube 2, as expressed by the below reaction formula 2, chlorine (Cl) contained in chemical species (—$SiH_2Cl$) react with the hydrogen radicals (in reaction formula 2, expressed by "$H_2$"), thereby hydrogen is substituted for the chlorine contained in the chemical species, and the chlorine is combined with hydrogen to form hydrogen chloride and is removed from the chemical species.

—$NH_2$+$SiH_2Cl$+$H_2$→—NH—$SiH_3$+HCl↑     (Reaction Formula 2)

In this way, chlorine concentration in the finally obtained silicon nitride film can be lowered, by removing chlorine in the chlorine removing step. If chlorine concentration in a silicon nitride film is lowered, wet-etch rate of the silicon nitride film is lowered, which will be described later.

After a desired amount of chlorine is removed from the chemical species on the semiconductor wafer W, the supply of hydrogen gas through the process gas supply pipe 8 is stopped, and the applying of RF power from the RF power source is stopped. Then, the interior of the reaction tube 2 is evacuated, while nitrogen gas is supplied into the reaction tube 2 at a predetermined flow rate such as 0.5 slm through the process gas supply pipe 9 as shown in item (c) of FIG. 4, thereby gases in the reaction tube 2 is discharged from the reaction tube 2 (Vacuuming Stage).

Subsequently, the ammonia supplying step is executed. First, nitrogen gas is supplied into the reaction tube 2 through the process gas supply pipe 9 at a predetermined flow rate such as 0.5 slm as shown in item (c) of FIG. 4, and the temperature of the interior of the reaction tube 2 is adjusted to a predetermined value such as 400° C. by the heaters 7 as shown in item (a) of FIG. 4. In addition, gases in the reaction tube 2 are evacuated so that the pressure in the reaction tube 2 is adjusted to a predetermined value such as 40 Pa as shown in item (b) of FIG. 4. The above operations are continued until the pressure and the temperature in the reaction tube 2 are stabilized at the predetermined values (Stabilizing Stage).

After the pressure and the temperature in the reaction tube 2 are stabilized, RF power of a predetermined frequency such as 13.56 MHz is applied (RF: ON) across the pair of electrodes 11 in the plasma generating unit 10 from the not shown the RF power source through the not shown matching circuit as shown in item (g) of FIG. 4, while ammonia gas is supplied into a space between the electrodes 11 through the process gas supply pipe 8 at a predetermined flow rate such as 3 slm as shown in item (f) of FIG. 4. Ammonia gas supplied into the space between the electrodes 11 is plasma-excited (i.e., activated) to be converted into ammonia radicals (NH3*), which are supplied form the plasma generating unit 10 into the reaction tube 2. In addition, nitrogen gas is supplied into the reaction tube 2 through the process gas supply pipe 9 at a predetermined flow rate such as 0.5 slm, as shown in item (c) of FIG. 4 (Flowing Stage).

The ammonia-gas flow rate is, preferably, in a range of 0.5 slm to 5 slm, more preferably, in a range of 3 slm to 5 slm. By using this flow-rate range, plasma can be generated without any trouble, and it is possible to supply a sufficient amount of ammonia radicals to nitride (i.e., form —SiNH$_2$ group) the chemical species (—SiH group) from which chlorine is removed in the chlorine removing step.

The RF power is, preferably, in a range of 50 W to 1000 W, more preferably, in a range of 100 W to 300 W. If higher than 300 W, quarts walls constituting the plasma generating unit 10 may be damaged.

Preferably, the pressure in the reaction tube 2 is in a range of 40 Pa to 100 Pa. By using this pressure range, ammonia radicals can be readily generated, and the mean free path of the ammonia radicals in the space where the semiconductor wafers W are placed becomes larger. More preferably, the pressure in the reaction tube 2 is in a range of 50 Pa to 70 Pa. By using this pressure range, the pressure in the reaction tube 2 can be readily regulated.

The pressure in the plasma generating unit 10 is, preferably, in a range of 70 Pa to 600 Pa, more preferably, in a range of 280 Pa to 330 Pa. By using this pressure range, plasma can be generated without any trouble, and it is possible to supply a sufficient amount of ammonia radicals to nitride (i.e., form —SiNH$_2$ group) the chemical species (—SiH group) from which chlorine is removed in the chlorine removing step.

As shown by the below reaction formula 3, —SiH group (in reaction formula 3, expressed by "—SiH$_3$") is converted or nitrided into —SiNH$_2$ group (in reaction formula 3, expressed by "—SiH$_2$(NH$_2$)") by ammonia radicals (in reaction formula 3, expressed by "NH$_3$"), thereby a very thin silicon nitride film is deposited on the semiconductor wafer W.

—NH+SiH$_3$+NH$_3$→—NH—SiH$_2$(NH$_2$)+H$_2$↑    (Reaction Formula 3)

In a case where —SiCl group exists on the surface of the semiconductor wafer W (this case occurs if the chlorine removing step is omitted in the illustrated embodiment), when ammonia radicals are supplied into the reaction tube 2, a reaction expressed by the below reaction formula 4 is not likely to occur, while a reaction expressed by the below reaction formula 5 is dominant.

—NH+SiH$_2$Cl+NH$_3$→—NH—SiH$_2$(NH$_2$)+ HCl↑    (Reaction Formula 4)

—NH+SiH$_2$Cl+NH$_3$→—NH—SiHCl(NH$_2$)+ H$_2$↑    (Reaction Formula 5)

This is because, the reaction expressed by the reaction formula 5, the reaction product (H$_2$) of which is stable under a low temperature such as 400° C. (temperature in the reaction tube 2), preferentially occurs. In the above case, chlorine concentration in the resultant silicon nitride film on the semiconductor wafer W becomes higher, resulting in a higher wet-etch rate of the silicon nitride film. As a result, etch selectivity of the silicon nitride film over an oxide film becomes smaller. Moreover, the film stress of the silicon nitride film becomes lower, and thus desired stress strength of the silicon nitride film cannot be achieved.

In this embodiment, hydrogen radicals are supplied prior to the supply of ammonia radical to remove chlorine, as expressed by reaction formula 2. Thus, chlorine concentration in the finally obtained silicon nitride film can be lowered, and accordingly, a silicon nitride film having a high film stress can be formed at a low process temperature. In addition, increase in the wet-etch rate of the silicon nitride film can be suppressed.

In addition, as Si—H bond is substituted for Si—Cl bond in the chlorine removing step, the reaction expressed by the reaction formula 3 is promoted. Thus, nitrogen concentration in the finally obtained silicon nitride film becomes higher. As a result, a silicon nitride film having a high film stress can be formed at a low process temperature.

The above-described DCS supplying step, chlorine removing step and ammonia supplying step forms one cycle, which is performed repeatedly for plural times such as 200 times (cycles). Thereby, a silicon nitride film of a desired film thickness is formed on each of the semiconductor wafers W.

After a silicon nitride film of a desired film thickness is formed on each of the semiconductor wafers W, the semiconductor wafers W are unloaded. In detail, a predetermined amount of nitrogen gas is supplied into the reaction tube 2 through the process gas supply pipe 9 so that the pressure in the reaction tube 2 is returned to normal pressure. The interior of the reaction tube 2 is maintained at a predetermined temperature by the heaters 7. Then, the lid 5 is lowered by the boat elevator 128 so that the semiconductor wafers W are unloaded from the reaction tube 2.

As mentioned above, in the foregoing embodiment, after removing chlorine contained in an adsorbate originated from DCS as a precursor, the adsorbate is nitrided by supplying ammonia. Thus, chlorine concentration in the silicon nitride film can be lowered, and accordingly, a silicon nitride film having a high film stress can be formed at a low process temperature. In addition, increase in the wet-etch rate of the silicon nitride film can be suppressed.

The present invention is not limited to the foregoing embodiment, and various modification and application are possible. Possible modifications will be described hereinafter.

In the foregoing embodiment, the DCS supplying step, the chlorine removing step and the ammonia supplying step forms one cycle, which cycle is performed repeatedly for 200 times (cycles). Alternatively, in first 100 cycles, the chlorine removing step may be omitted and thus one cycle may be formed of only the DCS supplying step and the ammonia supplying step. In this way, the film stress of the silicon nitride film may be controlled by changing the number of executions of the chlorine removing step. Also in this case, a silicon nitride film having a high film stress can be formed at a low process temperature, and increase of the etch-rate of the silicon nitride film can be suppressed. The chlorine concentration of the silicon nitride film, and thus the film stress of the silicon nitride film can be also controlled, by changing the execution time of the flowing stage of the chlorine removing step.

In the foregoing embodiment, 200-cycle of the DCS supplying step, the chlorine removing step and the ammonia supplying step are performed for forming the silicon nitride film. However, the present invention is not limited thereto. Smaller number of cycles such as 50 or 100 cycles is possible, and larger number of cycles such as 300 or 400 cycles is also possible. Also in this case, a silicon nitride film of a desired thickness can be formed, by appropriately changing process conditions, such as the DCS and/or ammonia gas supply rate and RF power, according to the change in the number of cycles.

In the foregoing embodiment, hydrogen radicals and ammonia radicals are formed by activating hydrogen gas and ammonia gas, respectively, by using plasma. Instead, another means, such as magnetic force or ultraviolet rays, may be used for activating hydrogen gas and/or ammonia gas.

In the foregoing embodiment, the chlorine removing step is performed by supplying hydrogen radicals. However, in the method according to the present invention, means for removing chlorine is not limited to hydrogen radicals, as long as a process step capable of removing chlorine originated from DCS gas and contained in the film is performed between the DCS supplying step and the ammonia supplying step.

In the foregoing embodiment, although nitrogen gas serving as a diluting gas is simultaneously supplied with the supply of the process gas (i.e., reaction gas) such as DCS gas, the supply of the diluting gas is not absolutely necessary. However, if a diluting gas is mixed to a process gas, the process time can be readily controlled, and the mixing of the diluting gas is preferable. The diluting gas is preferably an inert gas. Helium (He) gas, neon (Ne) gas or argon (Ar) gas may be used as the diluting gas, other than nitrogen gas.

In the foregoing embodiment, the silicon nitride film is formed by using a processing apparatus provided with the process gas supply pipe 8 for supplying process gases relating to the plasma process and the process gas supply pipe 9 for supplying process gases not relating to the plasma process. However, the present invention is not limited thereto. For example, the number of the process gas supply pipes may correspond to the number of sorts of the process gas. Plural process gas supply pipe 8 and plural process gas supply pipe 9 may penetrate the lower end portion of the reaction tube 2, and the plural process gas supply pipes may simultaneously supply the same process gas. Due to this, the process gas can be supplied into the reaction tube 2 uniformly.

In the foregoing embodiment, although a batch-type processing apparatus having a single-tube structure is used as the processing apparatus 1, another type of processing apparatus, such as a batch-type processing apparatus having a double-tube structure in which a reaction tube comprises an inner tube and an outer tube. The process object is not limited to a semiconductor wafer W, and may be a glass substrate for a liquid crystal display, for example.

The controller 100 of the processing apparatus 1 can be made by using a general-purpose computer system without using a computer system designed specially for the processing apparatus 1. For example, the controller 100 that makes the processing apparatus 1 execute the aforementioned process steps can be made, by installing programs for executing the aforementioned process steps on a general-purpose computer from a storage medium (e.g., a flexible disk or a CD-ROM).

Means for providing the above program is optional. The program may be provided via a storage medium as mentioned above. Alternatively, the program may be provided via a communication line, a communication network, a communication system and so on. For example, the program may be uploaded to a bulletin board system (BBS), and may be sent therefrom through a communication network while being superposed on a carrier wave. The aforementioned process may be carried out, by running the provided program under the control of the operating system (OS) in the same way as that of running conventional application programs.

The invention claimed is:

1. A method of forming a silicon nitride film using dichlorosilane, hydrogen radicals and ammonia radicals as reaction gases, comprising the steps of:
   (a) supplying dichlorosilane into a reaction chamber containing a process object without supplying hydrogen radicals and ammonia radicals, thereby allowing chemical species originated from dichlorosilane as a precursor to be adsorbed on the process object;
   (b) supplying hydrogen radicals into the reaction chamber without supplying dichlorosilane and ammonia radicals, thereby hydrogenating chlorine contained in the chemical species to remove the chlorine from the chemical species; and
   (c) supplying ammonia radicals into the reaction chamber without supplying dichlorosilane and hydrogen radicals, thereby nitriding the chemical species, from which the chlorine has been removed, by the ammonia radicals, to deposit resultant silicon nitride on the process object,
   wherein the steps (a), (b) and (c) are performed repeatedly for plural times in that order, and
   wherein the reaction gases remaining in the reaction chamber are substantially removed from the reaction chamber during a period after completion of the step (a) and before starting of the step (b), a period after completion of the step (b) and before starting of the step (c), and a period after completion of the step (c) and before starting of the step (a).

2. The method according to claim 1, wherein, in the step (a), pressure in the reaction chamber is in a range of 40 Pa to 100 Pa.

3. The method according to claim 1, wherein, in the step (c), ammonia radicals are generated by supplying ammonia to a plasma generating unit whose internal pressure is in a range of 70 Pa to 600 Pa, and the ammonia radicals thus generated are supplied into the reaction chamber from the plasma generating unit.

4. The method according to claim 1, wherein, in the step (b), pressure in the reaction chamber is in a range of 40 Pa to 100 Pa.

5. The method according to claim 1, wherein, in the step (b), hydrogen radicals are generated by supplying hydrogen to a plasma generating unit whose internal pressure is in a range of 70 Pa to 400 Pa, and the hydrogen radicals thus generated are supplied into the reaction chamber from the plasma generating unit.

6. The method according to claim 1, wherein, in the step (c), temperature in the reaction chamber is 200° C. to 500° C.

7. The method according to claim 1, further comprising a step of performing the steps (a) and (c) repeatedly for plural times without performing the step (b), before performing the steps (a), (b) and (c) repeatedly for plural times in that order.

8. The method according to claim 1, wherein an inert gas, which is not reactive with the reaction gases, is supplied into the reaction chamber throughout the steps (a), (b) and (c) and the periods.

9. The method according to claim 8, wherein the inert gas is selected from a group consisting of nitrogen gas, helium gas, neon gas and argon gas.

10. The method according to claim 8, wherein a rate of supply of the inert gas into the reaction chamber is increased during the period after completion of the step (a) and before starting of the step (b).

* * * * *